United States Patent [19]

Anschel et al.

[11] Patent Number: 4,931,310

[45] Date of Patent: Jun. 5, 1990

[54] PROCESS FOR TREATING THE SURFACE OF POLYIMIDES TO IMPROVE PROPERTIES TO RECEIVE METAL LAYER

[75] Inventors: Morris Anschel, Binghamton; Walter P. Pawlowski, Endicott, both of N.Y.

[73] Assignee: International Business Machines Corporation, Armonk, N.Y.

[21] Appl. No.: 275,825

[22] Filed: Nov. 25, 1988

[51] Int. Cl.$^5$ .............................................. B05D 3/06
[52] U.S. Cl. ................................ 427/55; 204/192.12; 427/306; 427/322; 427/437
[58] Field of Search ................... 427/96, 55, 304–307, 427/437, 322; 204/192.12

[56] References Cited

U.S. PATENT DOCUMENTS

| | | | |
|---|---|---|---|
| 29,134 | 2/1877 | Edelman et al. | 260/47 |
| 3,179,633 | 4/1965 | Endrey | 260/78 |
| 3,361,589 | 1/1968 | Lindsey | 117/118 |
| 3,416,994 | 12/1968 | Chalmers et al. | 161/227 |
| 3,505,168 | 4/1970 | Dunphy et al. | 161/227 |
| 3,770,528 | 11/1973 | Hermes | 156/2 |
| 3,770,573 | 11/1973 | Dunphy et al. | 161/227 |
| 4,424,095 | 1/1984 | Frisch et al. | 427/307 X |
| 4,440,643 | 4/1984 | Makino et al. | 210/500 |
| 4,543,295 | 9/1985 | St. Clair et al. | 428/458 |
| 4,623,563 | 11/1986 | Noda et al. | 427/379 |
| 4,731,287 | 3/1988 | Noda et al. | 428/332 |
| 4,775,449 | 10/1988 | Dumas et al. | 427/304 X |
| 4,842,946 | 6/1989 | Foust et al. | 427/304 X |

OTHER PUBLICATIONS

IBM Technical Disclosure Bulletin, vol. 24, No. 10, Mar. 1982, *Improved Adhesion Between Polymer and Polyimide Layers.*

IBM Technical Disclosure Bulletin, vol. 28, No. 6, Nov., 1985, *Switchable Interface for Resistive Ribbon Printing.*

*Primary Examiner*—Michael Lusignan

[57] ABSTRACT

A process is provided for improving the surface properties of polyimide articles which contain significant amounts of transimide. The surface of the polyimide containing the transimide is first treated with a base to convert the surface layer of both the polyimides and the transimides to polyamic salt. Thereafter the surface layer of the converted polyamic salt is treated with an acid to convert the layer to a polyamic acid. This is followed by a cure preferably in infrared radiation at a sufficiently rapid rate to prevent the formation of any significant amounts of transimide and provide only polyimide. Following this treatment metallization is applied to the improved surface layer.

17 Claims, No Drawings

PROCESS FOR TREATING THE SURFACE OF POLYIMIDES TO IMPROVE PROPERTIES TO RECEIVE METAL LAYER

BACKGROUND OF THE INVENTION

Conventionally polyimides are prepared by curing polyamic acid to remove a water molecule and convert the polyamic acid to a polyimide structure. Typically this curing is done at an elevated temperature in various types of ovens. In the case of films, the films are heated to cure the polyamic acid to polyimide throughout the entire body of the film and the film is then spooled or otherwise supported. With this type of bulk curing, i.e. curing over the entire body of the article, in many cases the curing process is incomplete and also the curing process will provide a mixture of end products which can include isoimides and transimides as well as polyimides. The polyimides and isomides are essentially linear and not branched whereas the transimides are a branched structure. These reactions of curing polyamic acid (PAA) to the polyimide, isoimide and transimide structures are as follows.

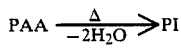

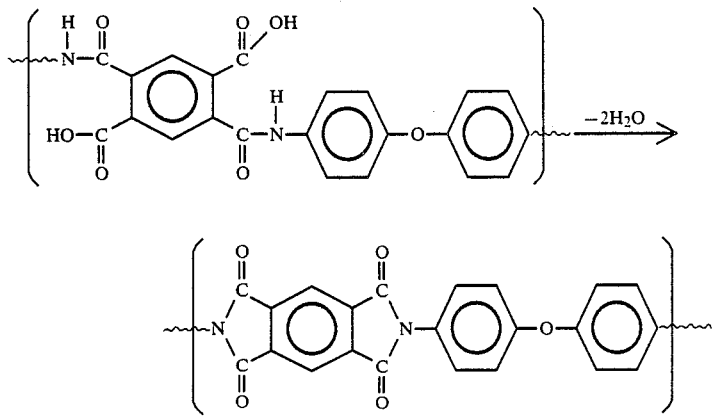

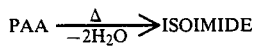

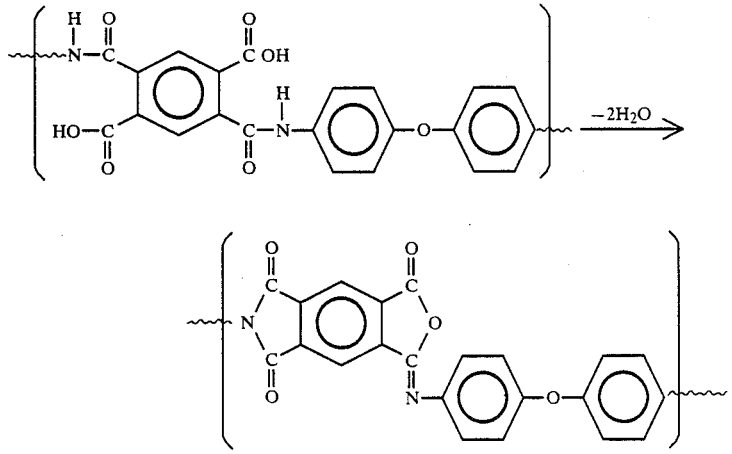

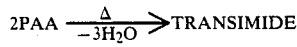

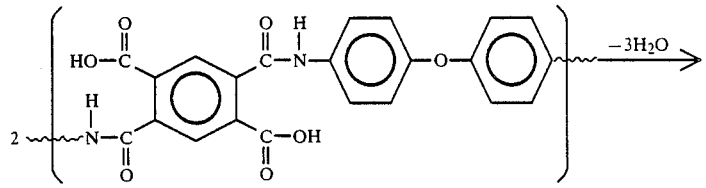

-continued

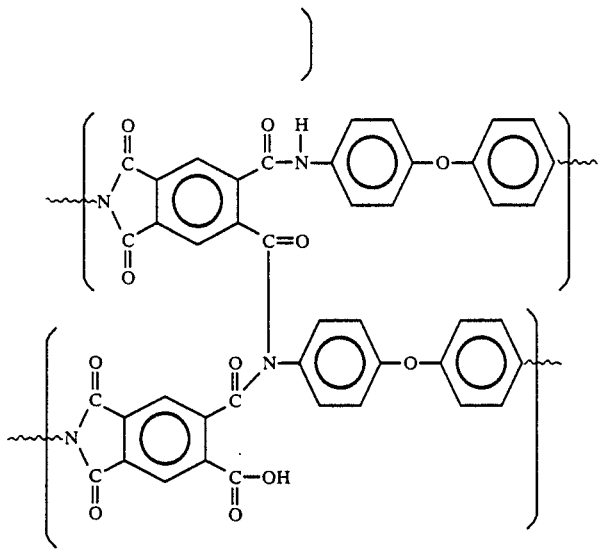

It has been found that the non-linear nature of the transimide structure results in a lower surface density as compared to the linear structure of the polyimide which provides a much higher density surface. This presence of the lower density structure of transimide in any appreciable amounts will result in an undesirable surface condition which allows the penetration into the surface of moisture which can migrate therein via ionic solvents. The presence of the moisture will tend to swell and plasticize the polyimide film which in turn degrades the surface properties and, in particular, may lead to tensile stresses at inner facial regions with embrittlement, delamination and stress cracking being prevalent. This can and does significantly lower the strength of a bond between any metalization or metal layer applied to the surface of the polyimide and the underlying substrate. Thus, in cases where metal is to be applied to the surface of a polyimide substrate, it is desirable to reduce to a minimum and preferably eliminate any low density branched structures such as transimides.

While the prior art has recognized the desirability to increase certain surface properties of polyimides, nevertheless, none have suggested a process for improving the surface properties for the reception of metal or metalization on the surface thereof. For example, U.S. Pat. No. 3,361,589 teaches a treatment of the surface of a polyimide with a base for the purpose of improving the adhesion of the polyimide to organic adhesives which may be applied thereto. This process is also taught in U.S. Pat. No. 3,505,168. U.S. Pat. No. 4,440,643 teaches a process of applying a coating of polyamic acid onto the surface of an existing polyimide and curing the added polyamic acid to provide an essentially dual layer polyimide structure. The following U.S. patents suggest various polyimide materials and various types of surface treatments for various purposes; 3,179,633, 3,416,994, 4,623,563, 4,731,287, 4,543,295, 3,770,573, 3,770,528, re. 29,134 also the following IBM Technical Disclosure Bulletins suggest various curing processes for polyimides.

Volume 28, No. 6; dated November 1985 pages 2646 and 2647;

Volume 24, No. 10; dated March, 1982, page 5110.

However, none of these patents or articles teach or suggest a method of improving the surface of an existing polyimide for the reception of a metal layer thereon.

SUMMARY OF THE INVENTION

According to the present invention, a process for improving the surface of a polyimide article which contains significant amounts of transimide is provided. In this process, the surface layer is treated with a base to convert the polyimide and transimide to polyamic acid salts. This is followed by a treatment of the polyamic acid salts so formed on the surface with an acid which will convert the polyamic acid salts to polyamic acid. Following this treatment, the polyamic acid is cured sufficiently rapidly to form linear polyimides only and prevent the formation of any significant amount of transimide. This preferably is done by infrared radiation.

DESCRIPTION OF THE PREFERRED EMBODIMENT(S)

It has been found that many types of commercially available polyimides, including polyimide films, have significant amounts of transimides present as well as smaller amounts of isoimides along with the desirable polyimide structure. For example, H Kapton polyimide films sold by E. I. DuPont Co. have been analyzed and shown to have as much as 20% transimide present as well as approximately 1% of isoimide. As indicated above, the transimide is a lower density structure than the polyimide and the isoimide due to its non-linear branched nature as opposed to the linear nature of the polyimides and isoimides. As noted above, this can result in significantly degraded surface properties of the polyimide article especially with respect to the adhesion of metal or metalization layers thereon. While the reason for the presence of the transimide is not completely understood, it is believed that it is probably related to the relative slowness of the bulk cure. Formation of linear polyimide from the polyamic acid is the preferred reaction if the reaction rate is sufficiently rapid to convert the polyamic acid to polyimide. This reaction is as follows:

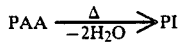

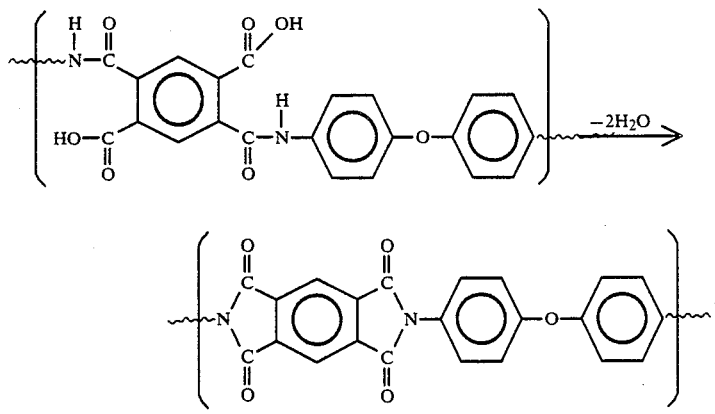

However, if the reaction rate is sufficiently slow the competing reaction in which transimide is formed from polyamic acid may take place forming an appreciable amount of the transimide. This reaction in which transimide if formed from polyamic acid is as follows:

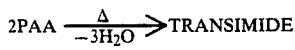

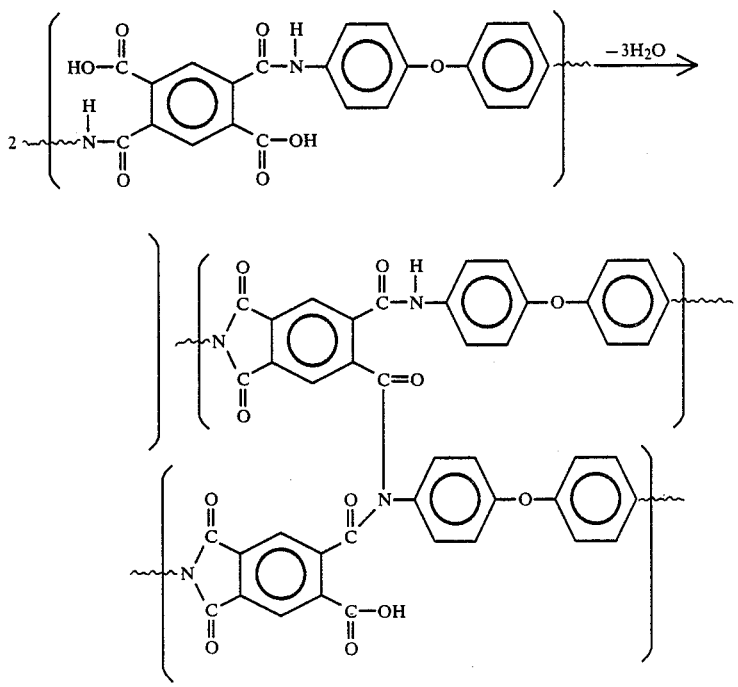

In any event whatever the reason for the presence of the transimide in the article, it does have an adverse effect on the surface of the article with respect to metal coatings applied thereto. The process of this invention removes the transimide present in polyimide articles by converting the surface layer of both the transimide and the polyimide back to polyamic acid and thereafter curing the thus converted surface layer sufficiently rapidly so that no significant transimide is formed but while forming only the more dense linear polyimide structure.

Broadly, the process comprises the treating of the surface layer of an article of polyimide with a base to convert the surface layer of the polyimide and transimide to polyamic acid salts. Of course, any isoimide present will also be then converted to polyamic acid salts. Thereafter the polyamic acid salts are treated with an acid to convert the polyamic acid salts to polyamic acid. Following this, the surface layer of polyamic acid is cured sufficiently rapidly to form only polyimide and not to form any appreciable amounts of transimide. This cure preferably is an infrared cure with the infrared radiation being in the range of 1–3 microns.

While the particular base and acids used are not critical, it is preferred that the base be either alkali metal hydroxides or alkaline metal hydroxides and more preferably an alkali metal hydroxide and specifically sodium hydroxide has been found to work very effectively. Similarly, any acid can be used although it is preferred that a weak acid such as an organic acid be used and more preferably acetic acid has been found to work quite well. The reactions converting both the polyimides and the transimide to polyamic acid salts and thereafter to polyamic acid and then curing of the polyamic acid surface layer to a polyimide are shown below:

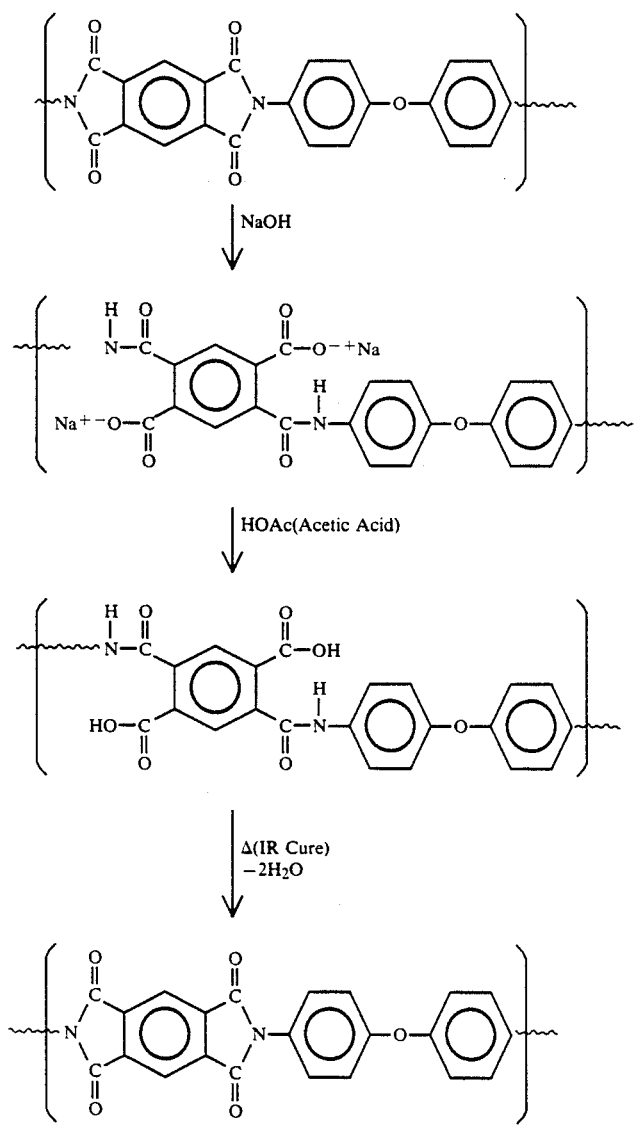

-continued
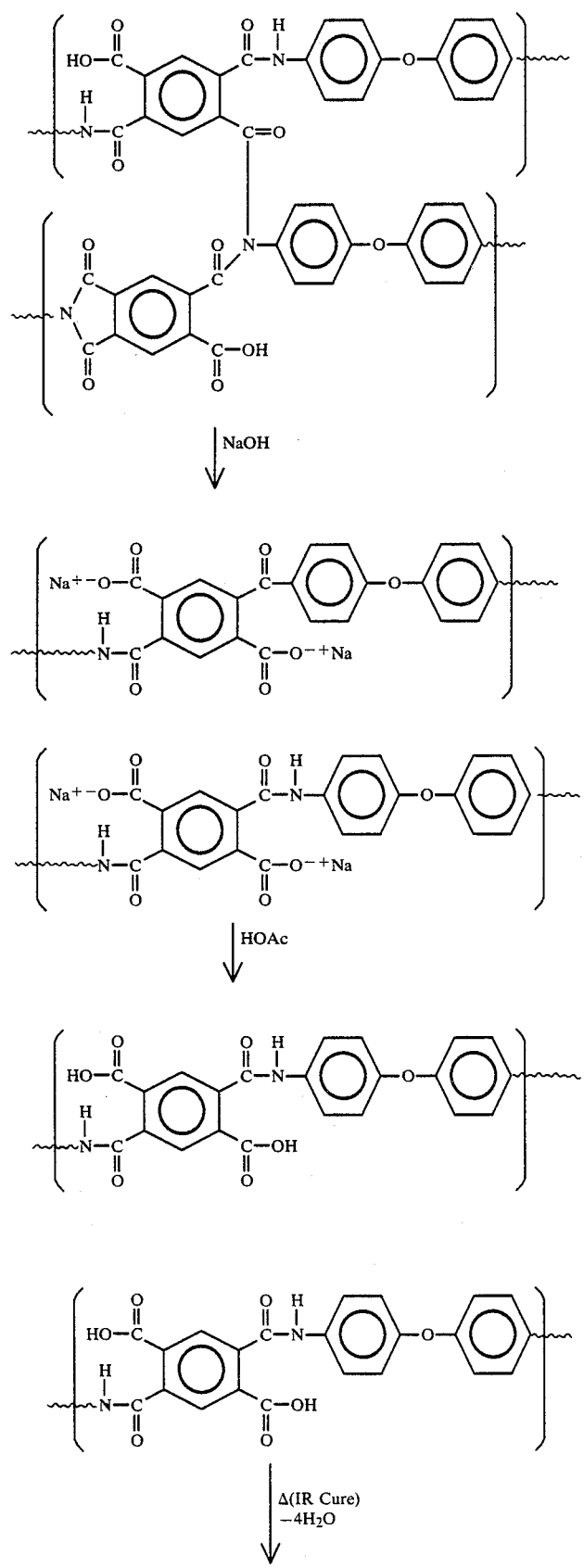

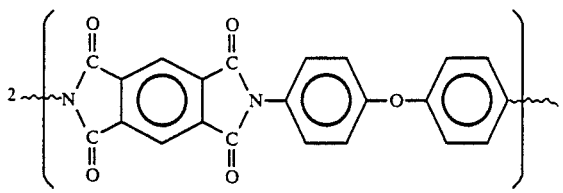

A specific preferred process was performed as follows. A 2 mil thick H Kapton strip (Kapton is a trademark of E. I. DuPont for a polyimide which is a condensation product of pyromellitic dianhydride and oxydianiline) was treated in a 0.8M NaOH spray for two minutes at 50° C., the spray being at 15-20 psi. This was followed by deionized water rinse at room temperature. (It is believed that this step converts both the polyimide and the transimide to polyamic acid salts.) This was followed by a two minute dip in 10% acetic acid at room temperature followed by a five minute deionized water soak which was followed by a one minute deionized water spray rinse at room temperature. (It is believed that this step converts the polyamic acid salts to polyamic acid.) The surface layer was then cured in an infrared curing oven for four minutes using a tungsten quartz source providing infrared radiation at 1-3 microns wave length. At this point, the process of converting the transimide to polyimide has been completed. The surface is now ready for metalization.

In order to test the effectiveness of the surface treatment, twenty samples of a Kapton strip were treated according to this method and had metalization applied to the surface thereof, and twenty samples of an untreated as received Kapton strip also had metallization applied to the surface thereof. The metalization in both cases was as follows. Sheets of Kapton material were preheated for six minutes at 50% power in a Leybold-Heraus vacuum furnace to about 200° C. This was followed by an $O_2$ plasma discharge surface treatment for one minute at 200 Watts at a flow of 490 sccm flow of $O_2$. The chromium and copper were sputtered on in a conventional manner in which a layer of about 250 angstroms thick of chromium was first applied followed by a layer about 3,000 angstroms thick of copper. Following this, a copper plate was put on over the layer of the chromium and copper; this was done in a conventional way utilizing a 10% $H_2SO_4$ solution at room temperature for one minute which solution contained 200 grams per liter of $H_2SO_4$, 20 grams per liter of copper sulphate and 50 parts per million of chlorine, to provide a copper plate on top of the seed layer of chromium and copper. The sample was left in the bath for fourteen minutes at 27° C. which resulted in a 0.3 mil thick layer of copper.

In order to prepare the various samples from the two large sheets of plated metal, one sheet being on the untreated substrate and the other on the treated substrate according to this process, standard substractive etching processes were performed to create 30 mil wide lines separated by 30 mil wide spaces which lines would be suitable for peel testing for shear strength. The plated substrates were subjected to selected etch in a solution of 564 grams per 250 milliliter of ferric chloride at 30° to etch the copper followed by a standard substractive chrome etching in a solution of 62 grams per liter of $KMnO_4$ and 40 grams per liter of NaOH at 40° C. followed by a dilute oxalic acid rinse. This resulted in two sheets of material having 30 mil Cr/Cu lines separated by 30 mil spaces thereon. Each of the sheets were then cut into 20 test pieces and peel tested on an Instrom tensile testing machine using the standard 90° peel test. The results of the 20 tests on each of the treated and untreated samples are as shown in Table I below:

TABLE I

|  | Untreated Kapton gm/mm | Kapton treated according to this Invention gm/mm |
|---|---|---|
| 1. | 23.6 | 56.3 |
| 2. | 22.9 | 58.2 |
| 3. | 24.6 | 57.2 |
| 4. | 23.3 | 57.3 |
| 5. | 24.2 | 57.5 |
| 6. | 22.1 | 58.1 |
| 7. | 25.4 | 56.8 |
| 8. | 23.8 | 56.2 |
| 9. | 23.7 | 57.9 |
| 10. | 24.0 | 58.1 |
| 11. | 23.2 | 57.6 |
| 12. | 24.6 | 55.9 |
| 13. | 24.9 | 56.8 |
| 14. | 23.1 | 57.4 |
| 15. | 25.1 | 57.8 |
| 16. | 23.6 | 57.8 |
| 17. | 23.7 | 56.1 |
| 18. | 23.8 | 58.0 |
| 19. | 23.5 | 56.0 |
| 20. | 23.0 | 56.2 |
|  | Avg. 23.8 gm/mm | Avg. 57.2 gm/mm |

As can be seen all of the samples on the substrate treated according to this invention had significantly better peel strength than any of the samples on an the untreated substrate. Indeed the average peel strength of the samples on the substrate treated according to this invention as compared to one that is untreated showed a peel strength over twice as great.

While the invention has been described to some degree of particularity, various adaptations and modifications can be made without departing from the scope of the invention as defined in the appended claims.

What is claimed is:

1. A process for improving the surface properties of a polyimide article for the reception of a metal film and wherein said polyimide article has substantial amounts of transimide present, said process comprising, in the order listed, the steps of:

treating the surface of the article with a base to convert the surface layer of the polyimide and transimide to polyamic acid salts, thereafter treating the surface with an acid to convert the polyamic acid salts to polyamic acid, and thereafter curing the surface layer of polyamic acid sufficiently rapidly to form a polyimide surface substantially free to transimide, whereby the surface properties of the article for the reception of a metal layer are improved.

2. The invention as defined in claim 1 wherein the base is selected from alkali metal hydroxides and alkaline metal hydroxides.

3. The invention as defined in claim 1 wherein the base is an alkali metal hydroxide.

4. The invention as defined in claim 3 wherein the base is sodium hydroxide.

5. The invention as defined in claim 1 wherein the acid is an organic acid.

6. The invention as defined in claim 5 wherein the acid is acetic acid.

7. The invention as defined in claim 1 wherein the curing step is performed by infrared radiation treatment of the surface.

8. The invention as defined in claim 7 wherein the infrared radiation is in the wave length of one to three microns.

9. A process for improving the adhesion of metals to the surface of a polyimide article wherein said polyimide article has substantial amounts of transimide present, said process comprising in the order listed the steps of:

treating the surface of the article with a base to convert the surface layer of the polyimide and transimide to polyamic acid salts to polyamic acid, thereafter curing the surface layer with polyamic acid sufficiently rapidly to form a polyimide surface substantially free of transimide, and thereafter applying a metallization layer to the surface of the article, whereby the adhesion of the metal to the surface of the article is improved.

10. The invention as defined in claim 9 wherein the base is selected from alkali metal hydroxides and alkaline metal hydroxides.

11. The invention as defined in claim 9 wherein the base is an alkali metal hydroxide.

12. The invention as defined in claim 11 wherein the base is sodium hydroxide.

13. The invention as defined in claim 9 wherein the acid is an organic acid.

14. The invention as defined in claim 13 wherein the acid is acetic acid.

15. The invention as defined in claim 9 wherein the curing step is performed by infrared radiation treatment of the surface.

16. The invention as defined in claim 15 wherein the infrared radiation is in the wave length of one to three microns.

17. The invention as defined in claims 9, 10, 11, 12, 13, 14, 15 or 16 wherein the metal is a composite layer of Cr and Cu.

* * * * *